(12) United States Patent
Kasanami et al.

(10) Patent No.: US 6,541,344 B2
(45) Date of Patent: Apr. 1, 2003

(54) SUBSTRATE PROCESSING APPARATUS AND SEMICONDUCTOR DEVICE MANUFACTURING METHOD

(75) Inventors: Katsuhisa Kasanami, Tokyo (JP); Eisuke Nishitani, Tokyo (JP); Michiko Nishiwaki, Hamura (JP); Satoshi Okada, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 09/981,629

(22) Filed: Oct. 16, 2001

(65) Prior Publication Data

US 2002/0072165 A1 Jun. 13, 2002

(30) Foreign Application Priority Data

Oct. 19, 2000 (JP) ........................................ 2000-318720

(51) Int. Cl.⁷ ............................................. H01L 21/336
(52) U.S. Cl. ...................................... 438/308; 438/522
(58) Field of Search ................................. 438/200, 308, 438/600, 758, 378, 502, 522

(56) References Cited

U.S. PATENT DOCUMENTS 5,650,082 A * 7/1997 Anderson
5,904,872 A * 5/1999 Arami et al.
6,403,479 B1 * 6/2002 Watanabe et al.

FOREIGN PATENT DOCUMENTS

| JP | 06-295914 | 10/1994 |
| JP | 09-007956 | 1/1997 |
| JP | 10-326788 | 12/1998 |

* cited by examiner

*Primary Examiner*—David Nelms
*Assistant Examiner*—Phuc T. Dang
(74) *Attorney, Agent, or Firm*—Hogan & Hartson, LLP

(57) ABSTRACT

A substrate processing apparatus includes a heater which heats a substrate through a susceptor on which the substrate is placed. The heater is divided into a plurality of zone heaters, and a reflecting member is interposed between at least two of the plurality of zone heaters.

20 Claims, 3 Drawing Sheets

SUBSTRATE PROCESSING APPARATUS AND SEMICONDUCTOR DEVICE MANUFACTURING METHOD

BACKGROUND OF THE INVENTION

1. Field of the Invention

The present invention relates to a substrate processing apparatus and a semiconductor device manufacturing method, and more particularly, to a substrate processing apparatus for processing a substrate such as a silicon substrate, a quartz substrate and a glass substrate, and to a semiconductor device manufacturing method in which the substrate processing apparatus can be preferably utilized.

2. Description of the Related Art

FIG. 4 shows one example of a substrate heating system of a conventional substrate processing apparatus. In order to enhance heat uniformity, a heater 10 is zone-divided into zone heaters 19 and 16, a susceptor 20 is divided into divided susceptors 29 and 23, the susceptors 29 and 23 are positioned above the zone heaters 19 and 16, respectively, and a wafer 50 which is a substrate to be processed is disposed on the susceptor 20. The divided susceptors 29 and 23 are heated by means of the zone heaters 19 and 16, thereby heating the wafer 50 and keeping the heat uniformity.

However, as shown in FIG. 4, due to the thickness of heater terminal fixing members 18 and the relative rotation between the susceptor 20 and the heater 10 to enhance the uniformity of a temperature across the entire surface of the wafer, this structure requires not a small gap between the susceptor 20 and the heater 10. If this gap exists, heat radiation is generated from the divided heaters 19 and 16. If the heaters are separated from each other, heat conduction between the divided heaters can be suppressed, but the heat radiation can not be suppressed by only separating the divided heaters from each other. Therefore, in an apparatus having a gap between the susceptor 20 and the heater 10, there is a problem that one zone heater receives radiation heat energy from another zone heater, and the susceptor 20 also receives radiation heat energy doubly from the zone heaters in the vicinity of the divided position. The heat radiation from the zone heater in other zones largely affects the uniformity, and this is one of factors which deteriorate the controlling performance of the heater and the heat uniformity characteristic.

Thus, it is a main object of the present invention to provide a substrate processing apparatus and a semiconductor device manufacturing method performing excellent temperature controllability and heat uniformity characteristics.

SUMMARY OF THE INVENTION

According to a first aspect of the present invention, there is provided a substrate processing apparatus including a heater which heats a substrate and a susceptor through which the heater heats the substrate, wherein the substrate is placed on the susceptor during processing of the substrate, wherein the heater is divided into a plurality of zone heaters, and a reflecting member is interposed between at least two of the plurality of zone heaters.

The substrate processing apparatus is preferably applied to a case wherein space exists between the susceptor and the heater.

Preferably, the heater is divided into an outer peripheral zone heater and at least one inner zone heater inside the outer peripheral zone heater, the reflecting member has a recessed cross section, and the reflecting member surrounds the inner zone heater except the outer peripheral zone heater.

Preferably, the reflecting member is provided between zone heaters, of the plurality of zone heaters, which are different in temperature by 70° C. or more.

Further, according to a second aspect of the present invention, there is provided a manufacturing method of a semiconductor device including heating a substrate by a heater through a susceptor wherein the substrate is placed on the susceptor during processing of the substrate, wherein the heater is divided into a plurality of zone heaters, and a reflecting member is interposed between at least two of the plurality of zone heaters.

This method is suitably applied to a case wherein space exists between the susceptor and the heater.

Preferably, the reflecting member is provided between zone heaters, of the plurality of zone heaters, which are different in temperature by 70° C. or more.

Further, according to a third aspect of the present invention, there is provided a substrate processing apparatus, including a reaction chamber, a heater, a reflecting member, and a susceptor. The reaction chamber includes a wafer transfer port through which a substrate passes as the substrate is transferred into and out from the reaction chamber, a gas introducing port, and a shower head coupled to the gas introducing port. The reaction gas is supplied into the reaction chamber through both the gas introducing port and the shower head. The heater is located within the reaction chamber and the heater is divided into a plurality of zone heaters for heating the substrate. The reflecting member is interposed between at least two of the plurality of zone heaters. The heater heats the substrate through the susceptor, wherein the substrate is placed on the susceptor during processing of the substrate."

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 1:
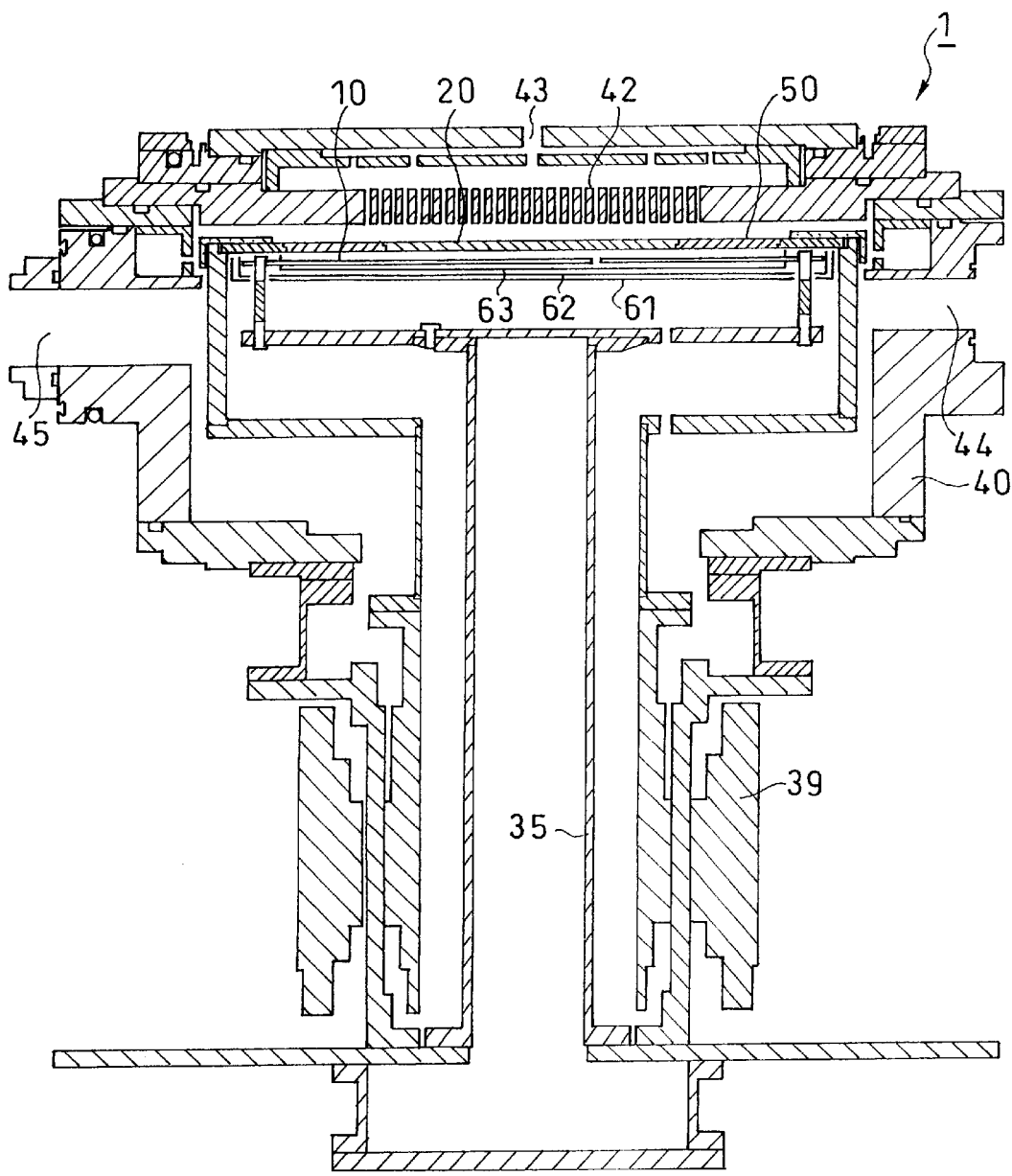
FIG. 1 is a schematic longitudinal sectional view for explaining a semiconductor wafer processing apparatus according to one embodiment of the present invention.

FIG. 1 is a schematic longitudinal sectional view for explaining a semiconductor wafer processing apparatus according to one embodiment of the present invention, FIG.

Figure 2:
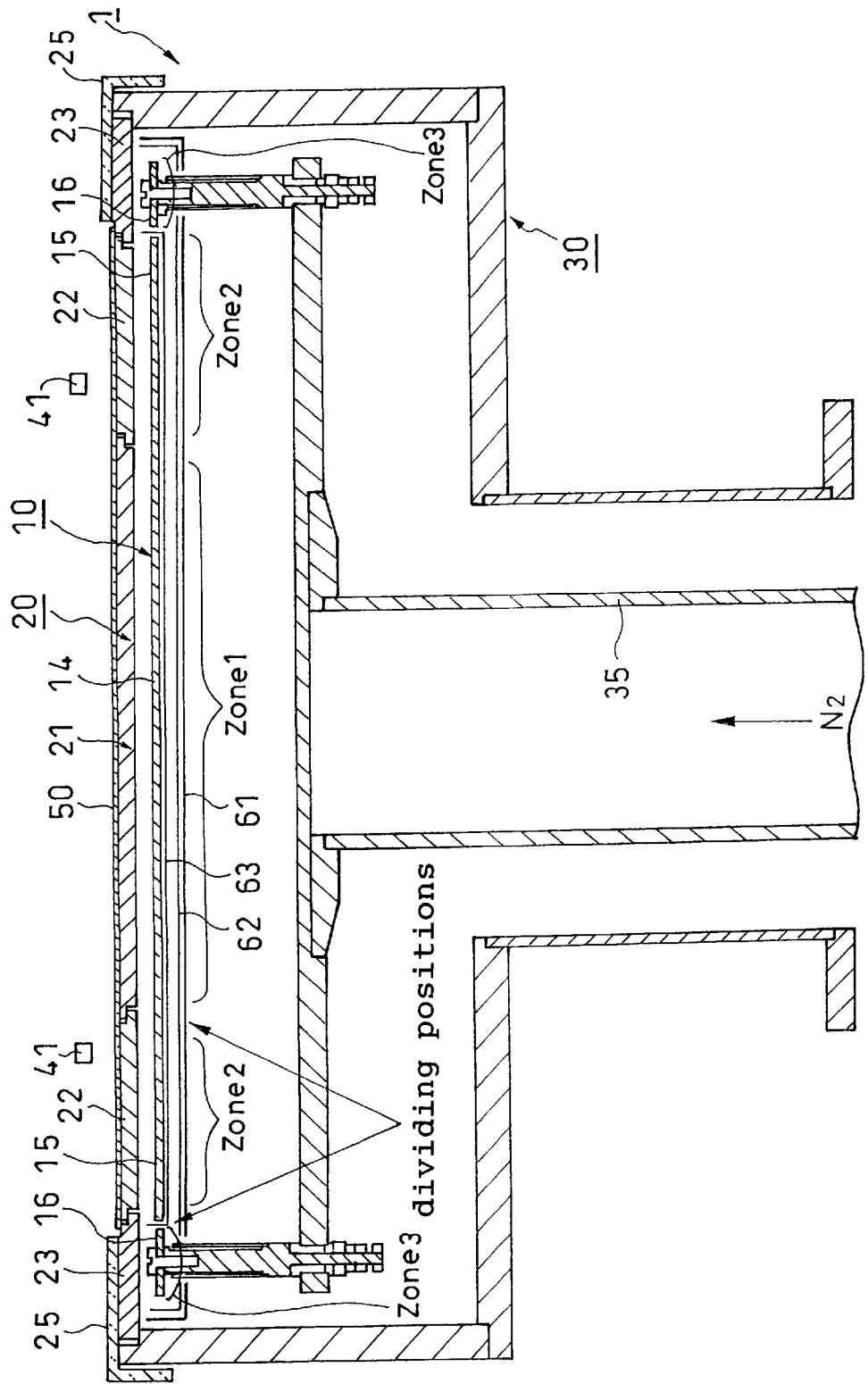
FIG. 2 is a partially enlarged schematic longitudinal sectional view for explaining the semiconductor wafer processing apparatus according to the one embodiment of the present invention.
Figure 3:
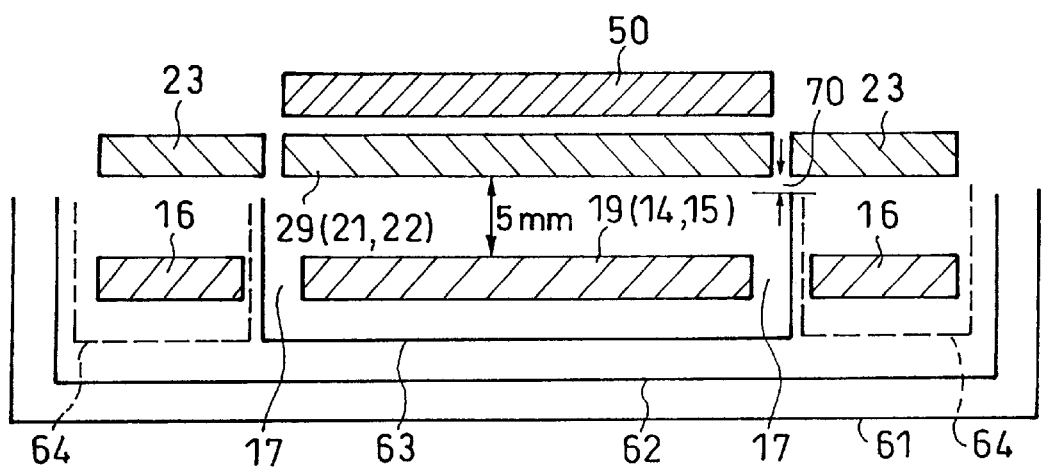
FIG. 3 is a partially enlarged schematic longitudinal sectional view for explaining the semiconductor wafer processing apparatus according to the one embodiment of the present invention.
Figure 4:
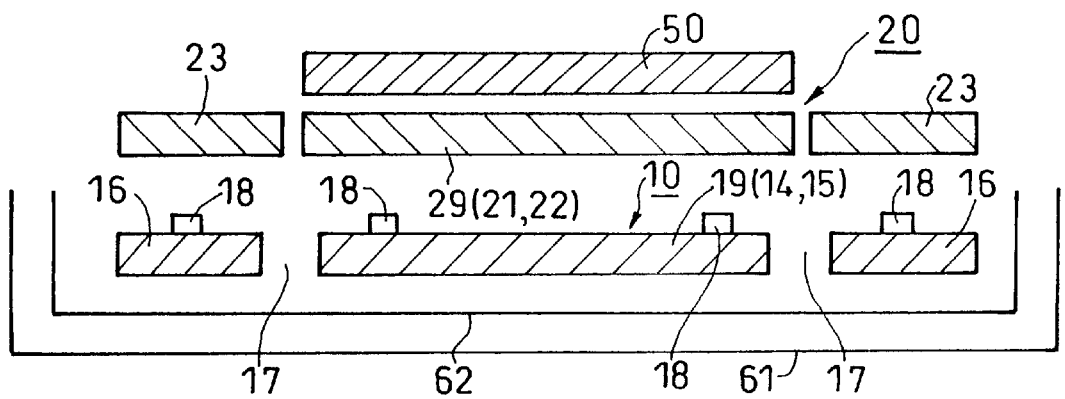
FIG. 4 is a partially enlarged schematic longitudinal sectional view for explaining a conventional semiconductor wafer processing apparatus.

2 is a partially enlarged schematic longitudinal sectional view of the semiconductor wafer processing apparatus, and FIG. 3 is a schematic longitudinal sectional view of a heater, a susceptor, a wafer and a reflector shown in FIG. 2.

A semiconductor wafer processing apparatus 1 of the present embodiment comprises a reaction chamber 40, a susceptor 20 on which a semiconductor wafer 50 is placed and which is provided in the reaction chamber 40, a heater 10 and reflectors 61 to 63 provided below the susceptor 20, a gas introducing port 43, a shower head 42 and the like. Reaction gas is supplied into the reaction chamber 40 in a manner of shower through the gas introducing port 43 and the shower head 42 and then, supplied onto the semiconductor wafer 50, and discharged from discharging hole 44. The wafer 50 is transferred into and out from the reaction chamber 40 through a wafer transfer port 45.

A temperature distribution across the surface of the wafer 50 is affected by a temperature of the susceptor 20. In order to secure the heat uniformity across the entire surface of the wafer, it is important to efficiently control a temperature of the susceptor 20. For this reason, the heater 10 is divided into three zone heaters 14, 15 and 16 in respective zones 1, 2 and 3, and the susceptor 20 is also divided into divided susceptors 21, 22 and 23 at positions corresponding to the respective dividing positions of the heater into respective zones. Each of the divided susceptors 21, 22 and 23 is made of carbon coated with SiC. A temperature of the heater 10 is controlled by three systems, i.e., the zones 1 to 3.

The temperature controllability is enhanced by temperature-controlling the divided zone heaters independently. The positions where the heater 10 is divided into the zone heaters correspond to the positions where the susceptor 20 is divided. For example, when it is necessary to increase the temperature of only a center portion of the susceptor, it is possible to increase the temperature of only the zone heater 14 in the zone 1.

The divided susceptor 21 below the wafer 50 is lifted by a wafer transfer mechanism (not shown), and the lifted wafer 50 is transferred in and out by a wafer transfer plate 41.

In the case of the heater 16 in the outer peripheral zone 3, since heat thereof is dissipated outward, it is necessary to increase a temperature of the heater 16 accordingly to be higher than those of the heater 15 in the zone 2 and the heater 14 in the zone 1 located inward. A difference in temperature between the heater 16 and the inner heater 15 in the zone 2 is increased and thus, a gap 17 (see FIG. 3) is provided between the heater 16 in the outer peripheral zone 3 and the heater 15 in the inner zone 2, thereby physically separating the heaters 16 and the heaters 15 from each other. Although temperatures of the heater 15 in the zone 2 and the heater 14 in the inner zone 1 are separately controlled, since a difference between the temperatures is small, heater patterns are disposed and formed on one plate. In FIG. 3, the heater 15 in the zone 2 and the heater 14 in the zone 1 are illustrated together as one inner heater 19. In FIG. 3, the inner divided susceptors 21 and 22 respectively corresponding to the heater 15 in the zone 2 and the heater 14 in the zone 1 are illustrated together as one inner susceptor 29.

Between the zone 2 and zone 3 of the heater 10, that is, between the heater 15 in the zone 2 and the heater 16 in the zone 3 (in FIG. 3, between the inner heater 19 and the heaters 16 in the zone 3), is provided a reflector 63 made of a material having a high reflection coefficient such as Ti, Mo or the like. More preferably, the reflector 63 is made of a material also having a strong corrosion-resistance. The reflector 63 has a recessed vertical cross section.

Examples of preferable material for the reflector 63 are Ti, Ni, Mo (molybdenum). Here, Ti and Ni are strong in corrosion-resistance, but are expensive. Mo is inexpensive but is prone to be corroded in $ClF_3$ gas which is cleaning gas. In the present embodiment, in order to prevent such gas from being mixed into the vicinity of the heater 10, $N_2$ gas is introduced from a lower portion of the inside of a heater support member 35 which supports the heater 10. Therefore, a reflector made of Mo is used.

The shorter a distance 70 between the susceptor 20 and the reflector 63, the better the condition is, and the distance 70 in this embodiment is set to be 3 mm.

The zones are spatially separated by providing the reflector 63 as described above.

With the above structure, since radiant heat energy is not transmitted outside the heater zones, heat interference from adjacent zone heaters does not occur, making it possible to independently control the heater zones.

Further, the susceptor 20 does not receive the radiant heat energy from the zones 2 and 3 doubly and thus, the heat uniformity characteristic of the wafer 50 which is to be heated is enhanced.

In this manner, the heat interference between the heater zones is prevented by the reflector 63, the temperatures are controlled independently between the heater zones, and the controllability and the heat uniformity characteristic can be enhanced.

As a condition for providing the reflector, if the reflector is provided in a region where the heater temperatures are largely different (a region where the temperature difference is 70° C. or more, especially 70° C. to 200° C.), especially great effect can be obtained. In this embodiment, the reflector 63 is therefore provided between the heaters 15 in the zone 2 and the heater 16 in the zone 3 (in FIG. 3, between the inner heater 19 and the heater 16 in the zone 3).

Instead of providing the reflector 63 at the central portion in this manner, a reflector 64 surrounding the heater 16 in the zone 3 may be provided. However, the central dish-like reflector 63 can easily be produced inexpensively as compared with the doughnut-like reflector 64. If it is unnecessary to reduce the cost, the reflector 64 is better to reduce the heat radiation from the outer heater 16 in the peripheral zone 3. Both the reflectors 63 and 64 may be provided.

The reflectors 61 and 62 having recessed longitudinal cross sections and surrounding all of the heater 14 in the zone 1, the heater 15 in the zone 2 and the heater 16 in the zone 3 are provided in a double-layered manner. These reflectors are provided for preventing the heat radiation to the lower portion and in the lateral direction. The above-described materials can preferably be used for the reflectors 61 and 62.

An escape of heat is reduced and a heat insulating effect is further enhanced by covering the outer peripheral divided susceptor 23 with a susceptor cover 25 made of quartz, which contributes to output reduction of the zone heater 16.

In order to obtain better uniformity across the entire surface of the wafer, a structure in which the wafer 50 (susceptor 20) and the heater 10 are relatively rotated is employed. In this structure, a support member 35 of the heater 10 is used as a stationary shaft, a support member 30 of the susceptor 20 on which the wafer 50 is placed is used as a rotation shaft, and the support member 30 is coupled to a rotation introducing machine 39 using magnet coupling and the like. Taking electrical wiring to the heater 10 and the like into account, the heater 10 is fixed and the susceptor 20 is rotated.

Figure 5:
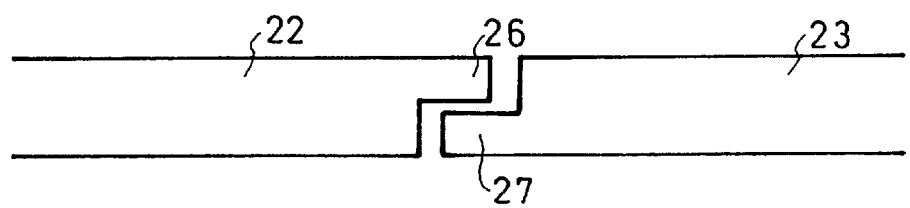
FIG. 5 is a schematic longitudinal sectional view for explaining a susceptor of the semiconductor wafer processing apparatus according to the one embodiment of the present invention.

As shown in FIG. 5, an engaging member 27 is formed on a lower side (on the side of the heater 10) of an inner end of the outer peripheral divided susceptor 23, and an engaging member 26 is formed on an upper side (on the side of the wafer 50) of an outer end of the inner divided susceptor 22, the engaging member 26 is superposed on the engaging member 27, and the divided susceptor 23 and the divided susceptor 22 are coupled to each other. The reason why the divided susceptors are coupled to each other with such a structure is to support the susceptor and to prevent heat from leaking in the vertical direction at the divided position. Other divided susceptors also have the same structure.

According to the above mentioned embodiment of the present invention, the temperatures can be controlled independently between the heater zones, the controllability is enhanced, and the heat uniformity characteristic is enhanced.

In this embodiment, the processing includes film-forming processing of a substrate to be processed and anneal processing.

The entire disclosure of Japanese Patent Application No. 2000-318720 filed on Oct. 19, 2000 including specification, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A substrate processing apparatus, comprising:
    a heater which heats a substrate; and
    a susceptor through which the heater heats the substrate, wherein the substrate is placed on the susceptor during processing of the substrate, wherein
        the heater is divided into a plurality of zone heaters, and a reflecting member is interposed between at least two of the plurality of zone heaters.

2. The substrate processing apparatus as recited in claim 1, wherein space exists between the susceptor and the heater.

3. The substrate processing apparatus as recited in claim 1, wherein the heater is divided into an outer peripheral zone heater and at least one inner zone heater inside the outer peripheral zone heater, the reflecting member has a recessed cross section, and the reflecting member surrounds the inner zone heater except the outer peripheral zone heater.

4. The substrate processing apparatus as recited in claim 1, wherein the reflecting member is provided between zone heaters, of the plurality of zone heaters, which are different in temperature by 70° C. or more.

5. A manufacturing method of a semiconductor device, comprising:
    heating a substrate by a heater through a susceptor, wherein the substrate is placed on the susceptor during processing of the substrate, wherein
        the heater is divided into a plurality of zone heaters, and a reflecting member is interposed between at least two of the plurality of zone heaters.

6. The manufacturing method of a semiconductor device as recited in claim 5, wherein space exists between the susceptor and the heater.

7. The manufacturing method of a semiconductor device as recited in claim 5, wherein the reflecting member is provided between zone heaters, of the plurality of zone heaters, which are different in temperature by 70° C. or more.

8. The substrate processing apparatus as recited in claim 1, wherein the susceptor is divided into a plurality of divided susceptors.

9. The substrate processing apparatus as recited in claim 8, wherein each of the divided susceptors is made of carbon coated with SiC.

10. The substrate processing apparatus as recited in claim 8, wherein each of the plurality of divided susceptors is adjacent to one of the plurality of zone heaters.

11. The substrate processing apparatus as recited in claim 1, wherein a temperature of each of the plurality of zone heaters is independently controlled.

12. The substrate processing apparatus as recited in claim 1, further comprising a gap between one of the plurality of zone heaters and another of the plurality of zone heaters.

13. The substrate processing apparatus as recited in claim 1, wherein the reflecting member is selected from the group consisting of Ti, Ni, and Mo.

14. The substrate processing apparatus as recited in claim 1, wherein the reflecting member is made from a corrosion-resistant material.

15. The substrate processing apparatus as recited in claim 1, wherein a distance between the reflecting member and the susceptor is approximately 3 millimeters.

16. The substrate processing apparatus as recited in claim 1, wherein the reflecting member prevents heat interference between at least two of the plurality of zone heaters.

17. The substrate processing apparatus as recited in claim 1, wherein the reflector surrounds at least one of the plurality of zone heaters.

18. The substrate processing apparatus as recited in claim 1, further comprising at least one additional reflecting member adjacent the plurality of zone heaters.

19. The substrate processing apparatus as recited in claim 1, further comprising a supporting member for supporting the susceptor, wherein the supporting member is coupled to a rotation introducing machine for rotating the supporting member.

20. A substrate processing apparatus, comprising:
    a reaction chamber including:
        a wafer transfer port through which a substrate passes as the substrate is transferred into and out from the reaction chamber;
        a gas introducing port; and
        a shower head coupled to the gas introducing port, wherein reaction gas is supplied into the reaction chamber through both the gas introducing port and the shower head;
    a heater located within the reaction chamber, the heater divided into a plurality of zone heaters for heating the substrate;
    a reflecting member interposed between at least two of the plurality of zone heaters; and
    a susceptor through which the heater heats the substrate, wherein the substrate is placed on the susceptor during processing of the substrate.

* * * * *